(12) United States Patent
Nomaru

(10) Patent No.: US 11,721,584 B2
(45) Date of Patent: Aug. 8, 2023

(54) WAFER PROCESSING METHOD INCLUDING CRUSHED LAYER AND WAFER PROCESSING APPARATUS

(71) Applicant: DISCO CORPORATION, Tokyo (JP)

(72) Inventor: Keiji Nomaru, Tokyo (JP)

(73) Assignee: DISCO CORPORATION, Tokyo (JP)

(*) Notice: Subject to any disclaimer, the term of this patent is extended or adjusted under 35 U.S.C. 154(b) by 347 days.

(21) Appl. No.: 17/142,429

(22) Filed: Jan. 6, 2021

(65) Prior Publication Data

US 2021/0233814 A1 Jul. 29, 2021

(30) Foreign Application Priority Data

Jan. 24, 2020 (JP) ................. 2020-009641

(51) Int. Cl.
*H01L 21/78* (2006.01)
*B23K 26/364* (2014.01)
*B28D 1/22* (2006.01)
*B28D 5/00* (2006.01)
*B23K 101/40* (2006.01)

(52) U.S. Cl.
CPC ............ *H01L 21/78* (2013.01); *B23K 26/364* (2015.10); *B28D 1/221* (2013.01); *B28D 5/0005* (2013.01); *B23K 2101/40* (2018.08)

(58) Field of Classification Search
CPC . H01L 21/78; H01L 21/67092; B23K 26/364; B23K 2101/40; B23K 26/53; B23K 26/0622; B28D 1/221; B28D 5/0005; B28D 5/0011
See application file for complete search history.

(56) References Cited

FOREIGN PATENT DOCUMENTS

| DE | 102014218759 A1 | * | 3/2015 | ........... B23K 26/402 |
|---|---|---|---|---|
| JP | 10305420 A | | 11/1998 | |
| JP | 4659301 B2 | * | 3/2011 | ........... C03B 33/091 |
| JP | 2012002604 A | | 1/2012 | |

* cited by examiner

*Primary Examiner* — John P. Dulka
(74) *Attorney, Agent, or Firm* — Greer, Burns & Crain, Ltd.

(57) ABSTRACT

A wafer is processed by irradiating a region to be divided with a pulse laser beam with a wavelength having absorbability to generate a thermal stress wave and propagate the wave to the inside of the region to be divided. A crushed layer is formed by executing irradiation, with a pulse laser beam with a wavelength having transmissibility with respect to the wafer, matching with a time when the thermal stress wave is generated and reaching a depth position at which a point of origin of dividing is to be generated at a sonic speed according to the material of the wafer. Absorption of the pulse laser beam with the wavelength having the transmissibility in a region in which the band gap is narrowed due to a tensile stress of the thermal stress wave forms a crushed layer that serves as the point of origin of dividing.

20 Claims, 3 Drawing Sheets

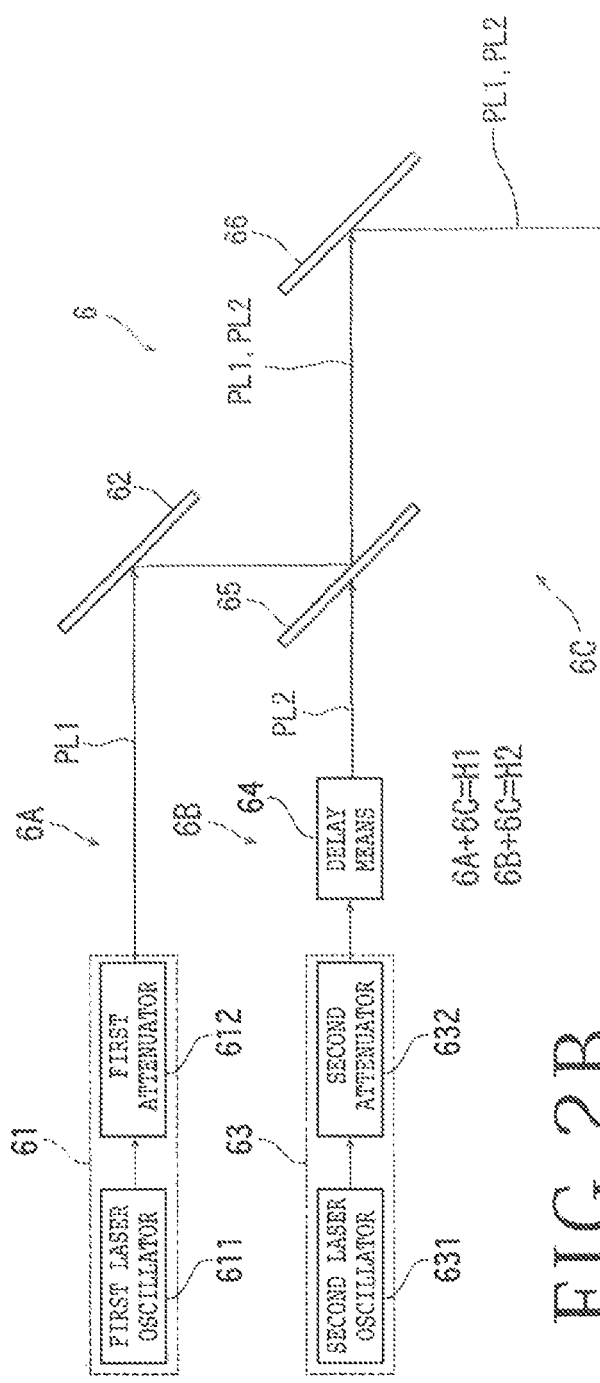
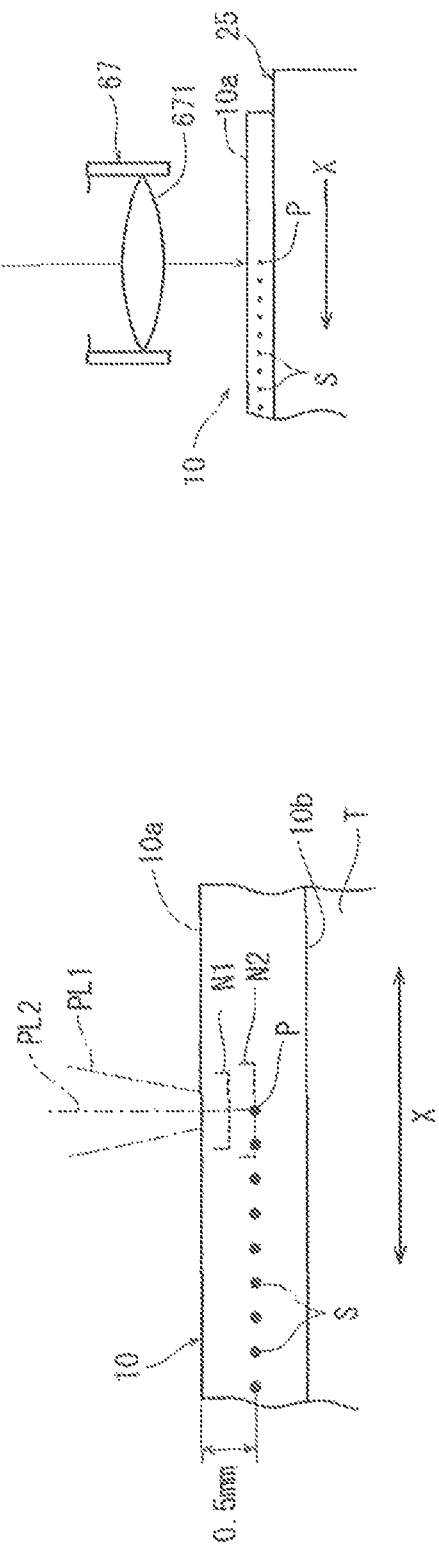
FIG.2A
FIG.2B

WAFER PROCESSING METHOD INCLUDING CRUSHED LAYER AND WAFER PROCESSING APPARATUS

BACKGROUND OF THE INVENTION

Field of the Invention

The present invention relates to a wafer processing method by which a wafer is divided into individual chips and a wafer processing apparatus that forms a point of origin of dividing from which a wafer is divided into individual chips.

Description of the Related Art

A wafer on which plural devices such as an integrated circuit (IC), large scale integration (LSI), and a light emitting diode (LED) are formed on a front surface in such a manner as to be marked out by plural planned dividing lines that intersect is divided into individual device chips by a laser processing apparatus. The device chips obtained by the dividing are used for pieces of electrical equipment such as mobile phones and personal computers.

The laser processing apparatus includes a chuck table that holds a workpiece (wafer), a laser beam irradiation unit that irradiates the workpiece held by the chuck table with a laser beam with a wavelength having absorbability with respect to the workpiece, an X-axis feed mechanism that executes processing feed of the chuck table and the laser beam irradiation unit relatively in an X-axis direction, and a Y-axis feed mechanism that executes indexing feed of the chuck table and the laser beam irradiation unit relatively in a Y-axis direction orthogonal to the X-axis direction. The laser processing apparatus positions a focal point to a planned dividing line of the wafer and executes irradiation to execute ablation processing, form a dividing groove in the planned dividing line and thereby divide the wafer into individual device chips (for example, refer to Japanese Patent Laid-open No. Hei 10-305420).

Furthermore, a laser processing apparatus includes a chuck table that holds a workpiece (wafer), a laser beam irradiation unit that irradiates the workpiece held by the chuck table with a laser beam with a wavelength having transmissibility with respect to the workpiece, an X-axis feed mechanism that executes processing feed of the chuck table and the laser beam irradiation unit relatively in an X-axis direction, and a Y-axis feed mechanism that executes indexing feed of the chuck table and the laser beam irradiation unit relatively in a Y-axis direction orthogonal to the X-axis direction. The laser processing apparatus positions the focal point of the laser beam to the inside of a planned dividing line of the wafer and executes irradiation to form a modified layer that serves as the point of origin of dividing inside the planned dividing line and divide the wafer into individual device chips (for example, refer to Japanese Patent Laid-open No. 2012-2604).

SUMMARY OF THE INVENTION

However, in order to position the focal point of the laser beam at a proper depth in the region to be divided in the wafer, the upper surface height of the region to be divided needs to be detected and stored in advance. Thus, there is a problem that the productivity is low.

Thus, an object of the present invention is to provide a wafer processing method and a wafer processing apparatus that can efficiently divide a wafer into individual chips without detecting the upper surface height of the region to be divided.

In accordance with an aspect of the present invention, there is provided a semiconductor wafer processing method for dividing a semiconductor wafer into individual chips. The semiconductor wafer processing method includes a holding step of holding the semiconductor wafer on a chuck table and a thermal stress wave generation step of irradiating a region to be divided with a pulse laser beam with a wavelength having absorbability with respect to the semiconductor wafer from an upper surface of the semiconductor wafer held by the chuck table, to generate a thermal stress wave and propagate the thermal stress wave to inside of the region to be divided. The semiconductor wafer processing method includes also a crushed layer formation step of executing irradiation with a pulse laser beam with a wavelength having transmissibility with respect to the semiconductor wafer from the upper surface of the semiconductor wafer in matching with a time when the thermal stress wave generated in the thermal stress wave generation step reaches a depth position at which a point of origin of dividing is to be generated, through propagating to the inside of the region to be divided at a sonic speed according to a material of the semiconductor wafer, and causing absorption of the pulse laser beam with the wavelength having the transmissibility in a region in which a band gap is narrowed due to a tensile stress of the thermal stress wave, to form a crushed layer that serves as the point of origin of dividing, and a dividing step of dividing the semiconductor wafer into the individual chips with use of the crushed layer as the point of origin of dividing.

In accordance with another aspect of the present invention, there is provided a semiconductor wafer processing apparatus that forms a point of origin of dividing from which a semiconductor wafer is divided into individual chips. The semiconductor wafer processing apparatus includes a chuck table that holds the semiconductor wafer and thermal stress wave generating means that irradiates a region to be divided with a pulse laser beam with a wavelength having absorbability with respect to the semiconductor wafer from an upper surface of the semiconductor wafer held by the chuck table, to generate a thermal stress wave and propagate the thermal stress wave to inside of the region to be divided. The semiconductor wafer processing apparatus includes also crushed layer forming means that executes irradiation with a pulse laser beam with a wavelength having transmissibility with respect to the semiconductor wafer from the upper surface of the semiconductor wafer in matching with a time when the thermal stress wave generated by the thermal stress wave generating means reaches a depth position at which the point of origin of dividing is to be generated, through propagating to the inside of the region to be divided at a sonic speed according to a material of the semiconductor wafer, and causes absorption of the pulse laser beam with the wavelength having the transmissibility in a region in which a band gap is narrowed due to a tensile stress of the thermal stress wave, to form a crushed layer that serves as the point of origin of dividing.

According to the wafer processing method of the present invention, the height of the upper surface of the wafer does not need to be detected each time, and the position at which the crushed layer that serves as the point of origin of dividing is formed can be controlled based on the propagation time calculated based on the sonic speed according to the material that forms the wafer. Thus, the productivity is improved.

According to the wafer processing apparatus of the present invention, similarly to the wafer processing method, a configuration that detects the height of the upper surface of the wafer each time does not need to be included, and the position at which the crushed layer that serves as the point of origin of dividing is formed can be controlled based on the propagation time calculated based on the sonic speed according to the material that forms the wafer. Thus, the productivity is improved.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 2A is a block diagram illustrating an optical system of a laser beam irradiation unit disposed in the wafer processing apparatus illustrated in FIG. 1;

FIG. 2B is an enlarged sectional view illustrating part of a wafer when a thermal stress wave generation step and a crushed layer formation step are executed.

DETAILED DESCRIPTION OF THE PREFERRED EMBODIMENTS

A wafer processing method of an embodiment of the present invention and a wafer processing apparatus suitable to carry out the wafer processing method will be described in detail below with reference to the accompanying drawings.

Figure 1:
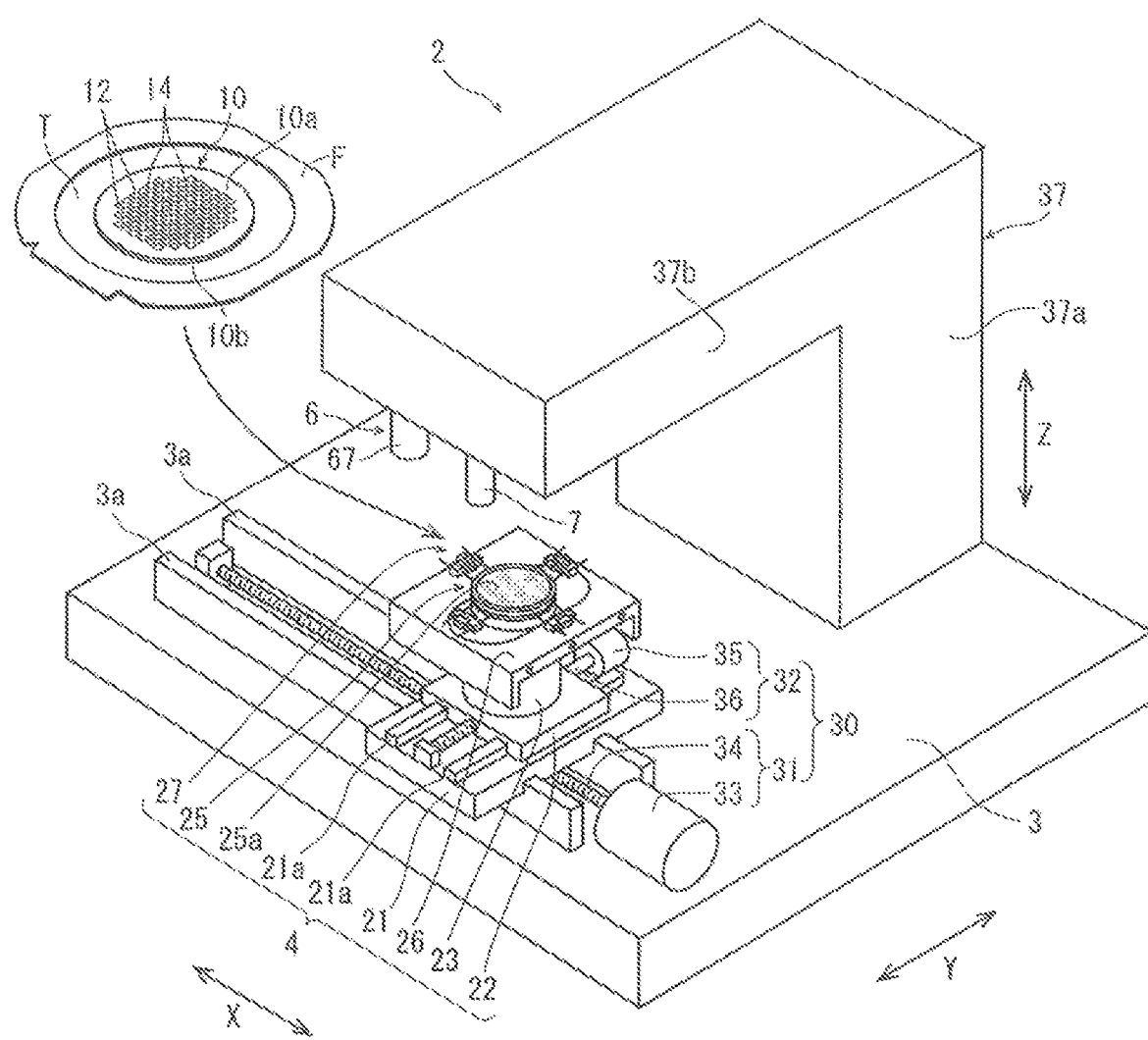
FIG. 1 is an overall perspective view of a wafer processing apparatus of an embodiment of the present invention.

In FIG. 1, an overall perspective view of a wafer processing apparatus 2 that is the present embodiment is illustrated. The wafer processing apparatus 2 includes a base 3, a holding unit 4 that holds a workpiece, a laser beam irradiation unit 6 including thermal stress wave generating means and crushed layer forming means that will be described in detail later, an imaging unit 7, a movement mechanism 30 that moves the holding unit 4, and a control unit (not illustrated).

The holding unit 4 includes a rectangular X-axis direction movable plate 21 placed over the base 3 movably in an X-axis direction indicated by an arrow X in the diagram and a rectangular Y-axis direction movable plate 22 placed over the X-axis direction movable plate 21 movably in a Y-axis direction indicated by an arrow Y in the diagram. The holding unit 4 includes also a circular cylindrical support column 23 fixed to the upper surface of the Y-axis direction movable plate 22 and a rectangular cover plate 26 fixed to the upper end of the support column 23. A circular chuck table 25 that passes through a long hole and extends upward is disposed on the cover plate 26. The chuck table 25 is configured to be rotatable by rotational drive means that is not illustrated in the diagram. A holding surface 25a defined by an X-axis coordinate and a Y-axis coordinate that configure the upper surface of the chuck table 25 is formed of a porous material, has air permeability, and is connected to unillustrated suction means by a flow path that passes inside the support column 23. Clamps 27 for fixing an annular frame F that supports the workpiece through a protective tape T are also disposed on the chuck table 25. The workpiece in the present embodiment is, for example, a wafer 10 illustrated in FIG. 1. The wafer 10 has a thickness of 1.0 mm and, on a silicon substrate, devices 12 are formed on a front surface 10a in such a manner as to be marked out by planned dividing lines 14. The wafer 10 is stuck to the protective tape T in such a manner that the front surface 10a is oriented upward and the side of a back surface 10b is oriented downward, and is held by the annular frame F through the protective tape T.

The movement mechanism 30 is disposed on the base 3 and includes an X-axis direction feed unit 31 that executes processing feed of the holding unit 4 in the X-axis direction and a Y-axis direction feed unit 32 that executes indexing feed of the Y-axis direction movable plate 22 in the Y-axis direction. The X-axis direction feed unit 31 converts rotational motion of a pulse motor 33 to linear motion through a ball screw 34 and transmits the linear motion to the X-axis direction movable plate 21 to cause the X-axis direction movable plate 21 to advance and retreat in the X-axis direction along guide rails 3a on the base 3. The Y-axis direction feed unit 32 converts rotational motion of a pulse motor 35 to linear motion through a ball screw 36 and transmits the linear motion to the Y-axis direction movable plate 22 to cause the Y-axis direction movable plate 22 to advance and retreat in the Y-axis direction along guide rails 21a on the X-axis direction movable plate 21. Although diagrammatic representation is omitted, position detecting means is disposed for the X-axis direction feed unit 31, the Y-axis direction feed unit 32, and the chuck table 25. Thus, the X-axis coordinate, the Y-axis coordinate, and the rotational position in the circumferential direction regarding the chuck table 25 are correctly detected, and position information thereof is sent to the control unit that is not illustrated in the diagram. Then, by an instruction signal issued from the control unit on the basis of the position information, the X-axis direction feed unit 31, the Y-axis direction feed unit 32, and the unillustrated rotational drive means of the chuck table 25 are driven, and the chuck table 25 can be positioned to a desired position over the base 3.

As illustrated in FIG. 1, a frame body 37 is disposed upright on a lateral side of the movement mechanism 30. The frame body 37 includes a vertical wall part 37a disposed on the base 3 and a horizontal wall part 37b that extends in the horizontal direction from the upper end part of the vertical wall part 37a. An optical system of the laser beam irradiation unit 6 is housed inside the horizontal wall part 37b of the frame body 37, and a light collector 67 that configures part of this optical system is disposed on the lower surface of the tip part of the horizontal wall part 37b.

The imaging unit 7 is disposed on the lower surface of the tip of the horizontal wall part 37b and at a position spaced from the light collector 67 of the laser beam irradiation unit 6 in the X-axis direction. In the imaging unit 7, the following components are included according to need: a normal imaging element (charge coupled device (CCD)) that executes imaging by a visible beam, infrared irradiation means that irradiates a workpiece with infrared rays, an optical system that captures the infrared rays with which irradiation is executed by the infrared irradiation means, an imaging element (infrared CCD) that outputs an electrical signal corresponding to the infrared rays captured by this optical system, and so forth. An image obtained by imaging by the imaging unit 7 is sent to the control unit and is displayed on a display unit (not illustrated) as appropriate.

The control unit is formed of a computer and includes a central processing unit (CPU) that processes arithmetic operation according to a control program, a read-only memory (ROM) that stores the control program and so forth, and a readable-writable random access memory (RAM) that stores an arithmetic operation result and so forth. Furthermore, the control unit is electrically connected to the laser beam irradiation unit 6, the imaging unit 7, the movement mechanism 30, and so forth and controls operation of the respective units.

With reference to FIG. 2A, the optical system of the laser beam irradiation unit 6 housed in the horizontal wall part 37*b* of the wafer processing apparatus 2 will be described. The optical system of the laser beam irradiation unit 6 illustrated in FIG. 2A includes a first laser beam generating part 6A that generates a first pulse laser beam PL1 with a wavelength having absorbability with respect to the wafer 10 that is a workpiece and a second laser beam generating part 6B that generates a second pulse laser beam PL2 with a wavelength having transmissibility with respect to the wafer 10. The optical system includes also a laser beam introducing part 6C that guides and applies the first pulse laser beam PL1 generated by the first laser beam generating part 6A and the second pulse laser beam PL2 generated by the second laser beam generating part 6B to the upper surface (front surface 10*a*) of the wafer 10 held by the chuck table 25 of the holding unit 4. In FIG. 2A, the protective tape T stuck to the wafer 10 and the frame F are omitted for convenience of explanation.

The first laser beam generating part 6A of the present embodiment includes first laser beam generating means 61 and a reflective mirror 62 that changes the optical path of the first pulse laser beam PL1 emitted from the first laser beam generating means 61. The first laser beam generating means 61 includes a first laser oscillator 611 that emits the first pulse laser beam PL1 with a wavelength of, for example, 355 nm having absorbability with respect to the material (silicon (Si)) that forms the wafer 10 and a first attenuator 612 that adjusts the output power of the first pulse laser beam PL1 emitted from the first laser oscillator 611 to desired output power and emits the adjusted first pulse laser beam PL1 toward the reflective mirror 62.

The second laser beam generating part 6B includes second laser beam generating means 63 and delay means 64 that delays the second pulse laser beam PL2 emitted from the second laser beam generating means 63 by a desired time. The second laser beam generating means 63 includes a second laser oscillator 631 that emits the second pulse laser beam PL2 with a wavelength of, for example, 1,064 nm having transmissibility with respect to the material (Si) that forms the wafer 10 and a second attenuator 632 that adjusts the output power of the second pulse laser beam PL2 emitted from the second laser oscillator 631. The second laser oscillator 631 is set to operate at the same repetition frequency as the above-described first laser oscillator 611 and emits the second pulse laser beam PL2 at a timing in synchronization with the first pulse laser beam PL1. The delay means 64 that delays the second pulse laser beam PL2 emitted from the second laser oscillator 631 is implemented by outputting the second pulse laser beam PL2 via an optical fiber (not illustrated) with a length corresponding to the delayed time, for example.

The laser beam introducing part 6C includes a dichroic mirror 65 that reflects the first pulse laser beam PL1 reflected by the reflective mirror 62 of the first laser beam generating part 6A and allows transmission of the second pulse laser beam PL2 guided from the second laser beam generating part 6B therethrough. The laser beam introducing part 6C includes also a reflective mirror 66 that changes the optical path of the light emitted from the dichroic mirror 65 and the light collector 67 including an fθ lens 671 that focuses the light reflected by the reflective mirror 66 on a position of the planned dividing line 14 of the front surface 10*a* of the wafer 10 held by the chuck table 25, to execute irradiation. The first pulse laser beam PL1 and the second pulse laser beam PL2 guided to the above-described dichroic mirror 65 are applied to the same region on the chuck table 25.

Thermal stress wave generating means H1 of the present invention is formed by the above-described first laser beam generating part 6A and laser beam introducing part 6C. The thermal stress wave generating means H1 is means that irradiates the front surface 10*a* positioned as the upper surface of the wafer 10 held by the holding unit 4 with the first pulse laser beam PL1 with the wavelength having absorbability with respect to the wafer 10 and generates a thermal stress wave to propagate this thermal stress wave to the inside of the wafer 10.

Furthermore, crushed layer forming means H2 of the present invention is formed by the above-described second laser beam generating part 6B and laser beam introducing part 6C. The crushed layer forming means H2 is means that executes irradiation with the second pulse laser beam PL2 with the wavelength having transmissibility with respect to the wafer 10 from the front surface 10*a* of the wafer 10 in matching with a predetermined time when the thermal stress wave generated at the front surface 10*a* of the wafer 10 by the thermal stress wave generating means H1 reaches a depth position at which the point of origin of dividing is to be formed from the front surface 10*a* of the wafer 10 (for example, depth of 0.5 mm from the front surface 10*a* of the wafer 10), through propagating inside the wafer 10 at a sonic speed according to the material of the wafer 10, and causes absorption of the second pulse laser beam PL2 in a region in which the band gap is narrowed due to a tensile stress of this thermal stress wave, to form a crushed layer.

An embodiment of the wafer processing method that can be carried out by using the above-described wafer processing apparatus 2 and that is for processing the wafer 10 will be described more specifically with reference to FIG. 2A and FIG. 2B.

For dividing the wafer 10 into individual chips, first, the holding unit 4 is caused to hold the wafer 10 (holding step). More specifically, the wafer 10 supported by the annular frame F through the protective tape T is prepared (see FIG. 1), and the side of the protective tape T is placed on the holding surface 25*a* of the chuck table 25. Then, the suction means that is not illustrated in the diagram is actuated to make the state in which the wafer 10 is sucked and held by the chuck table 25.

Subsequently, a thermal stress wave generation step and a crushed layer formation step are executed. At this time, the movement mechanism 30 is actuated to position the wafer 10 below the imaging unit 7, and the front surface 10*a* of the wafer 10 is imaged by the imaging unit 7. The position of the planned dividing line 14 that is the region to be divided is thereby detected and stored in the control unit as appropriate (alignment step).

After this alignment step has been executed, the wafer 10 is moved to the lower side of the light collector 67. Then, based on the information detected in the alignment step, the planned dividing line 14 is set along the X-axis direction and the position at which processing is to be started in the planned dividing line 14 is positioned directly under the light collector 67.

Subsequently, the thermal stress wave generating means H1 is actuated to generate the first pulse laser beam PL1 with the waveform of 355 nm having absorbability with respect to the material of the wafer 10 (Si), and the region to be divided, i.e., the planned dividing line 14, is irradiated with the first pulse laser beam PL1 from the front surface 10a of the wafer 10 through the laser beam introducing part 6C (thermal stress wave generation step).

The condition of the laser beam irradiation executed in the above-described thermal stress wave generation step is, for example, as indicated below. In the thermal stress wave generation step, the average output power of the first pulse laser beam PL1 adjusted by the first attenuator 612 of the thermal stress wave generating means H1 is adjusted to such low output power that the first pulse laser beam PL1 is a laser beam having absorbability with respect to the wafer 10 and ablation does not occur at the front surface 10a of the wafer 10.

Wavelength: 355 nm
Repetition frequency: 50 kHz
Average output power: 1 W
Pulse width: 100 ps or shorter When the front surface 10a of the wafer 10 is irradiated with the first pulse laser beam PL1 by the above-described thermal stress wave generation step, the front surface 10a of the wafer 10 is thermally excited and, as illustrated in FIG. 2B, a thermal stress wave generated by this thermal excitation propagates inside the wafer 10 as indicated by N1→N2 in the diagram. The speed of the thermal stress wave that propagates like this thermal stress wave N1→N2 is a sonic speed (9,620 m/s) according to the material (Si) that forms the wafer 10. The thermal stress wave that propagates in the semiconductor such as silicon in this manner is a short-pulse tensile stress wave, and the band gap becomes narrower compared with the normal state at a position to which the tensile stress is applied. That is, the region in which the band gap is narrower propagates from the front surface 10a toward the back surface 10b. Furthermore, the crushed layer formation step executed with the above-described thermal stress wave generation step is executed as follows.

In execution of the crushed layer formation step, the crushed layer forming means H2 is actuated to emit the second pulse laser beam PL2 with a wavelength (1,064 nm) having transmissibility with respect to the material that forms the wafer 10 (Si) by the second laser oscillator 631 in synchronization with the first laser oscillator 611 at the same repetition frequency (50 kHz). Subsequently, the second pulse laser beam PL2 is adjusted to predetermined output power by the second attenuator 632, and is delayed by the delay means 64 by a predetermined time with respect to the first pulse laser beam PL1 and is output. This predetermined time by which the second pulse laser beam PL2 is delayed by the delay means 64 of the second laser beam generating part 6B is the time until the thermal stress wave generated at the front surface 10a of the wafer 10 in the above-described thermal stress wave generation step reaches the depth position (0.5 mm) in the wafer 10 at which the point of origin of dividing is to be formed, at the sonic speed (9,620 m/s) of propagation inside the wafer 10. In the present embodiment, the predetermined time is 52 ns. The second pulse laser beam PL2 is applied to the region irradiated with the first pulse laser beam PL1 on the planned dividing line 14 of the front surface 10a of the wafer 10 through the laser beam introducing part 6C.

The condition of the laser beam irradiation executed in the above-described crushed layer formation step is, for example, as indicated below.

Wavelength: 1,064 nm
Repetition frequency: 50 kHz
Average output power: 10 W
Pulse width: 10 ns When the above-described thermal stress wave generation step and crushed layer formation step are executed, the second pulse laser beam PL2 with which the irradiation is executed by the crushed layer forming means H2 is delayed by the predetermined time (52 ns) with respect to the first pulse laser beam PL1. Due to this, as illustrated in FIG. 2B, the front surface 10a of the wafer 10 is irradiated with the first pulse laser beam PL1, and the thermal stress wave (N1 and N2) is formed to be propagated at the sonic speed (propagation speed) according to Si that forms the wafer 10. Thus, the region in which the band gap is narrowed is formed at a position P of 0.5 mm as the depth position of the region in which the point of origin of dividing is to be formed from the front surface 10a, and the second pulse laser beam PL2 is absorbed at the position P. As a result, a breaking stress is applied to the position P inside the wafer 10, and the inside of the wafer 10 is locally crushed to form a crushed layer S.

When the above-described thermal stress wave generation step and crushed layer formation step are executed, the movement mechanism 30 is also simultaneously actuated, and processing feed of the chuck table 25 is executed in the X-axis direction to form the crushed layer S at positions of the predetermined depth (0.5 mm) along the planned dividing line 14 positioned along the X-axis direction, as illustrated in FIG. 2B. After the crushed layer S has been formed in this manner, the Y-axis direction feed unit 32 of the movement mechanism 30 is actuated, and indexing feed of the wafer 10 is executed to position the adjacent planned dividing line 14 yet to be processed directly under the light collector 67. Then, the above-described thermal stress wave generation step and crushed layer formation step are executed. In addition, the X-axis direction feed unit 31 is actuated to form the crushed layer S similar to the above-described one inside the planned dividing line 14. After the crushed layer S has been formed inside all planned dividing lines 14 along the predetermined direction in this manner, the unillustrated rotational drive means that rotates the chuck table 25 is controlled to rotate the chuck table 25 by 90 degrees. Then, the crushed layer S is formed inside all planned dividing lines 14 formed along the direction orthogonal to the planned dividing lines 14 in which the crushed layer S has previously been formed. Through the above, the crushed layer S that serves as the point of origin of dividing the wafer 10 into individual chips is formed along all planned dividing lines 14.

According to the above-described embodiment, the front surface 10a that forms the upper surface of the wafer 10 is irradiated with the first pulse laser beam PL1 with the wavelength having absorbability with respect to the wafer 10, and the thermal stress wave is generated and propagated. Further, irradiation with the second pulse laser beam PL2 delayed by the propagation time until this thermal stress wave reaches the depth position at which the point of origin of dividing is to be generated is executed. By only executing the above-described process, the position at which the crushed layer S is formed can be controlled without detecting the height of the upper surface (front surface 10a) of the wafer 10.

After the thermal stress wave generation step and the crushed layer formation step have been completed in the above-described manner, a dividing step is executed in order to divide the wafer 10 into individual device chips 12' with use of the crushed layer S as the point of origin. Publicly-known means can be employed for this dividing step. For example, the dividing step can be executed by using a dividing apparatus 70 illustrated in FIG. 3.

Figure 3:
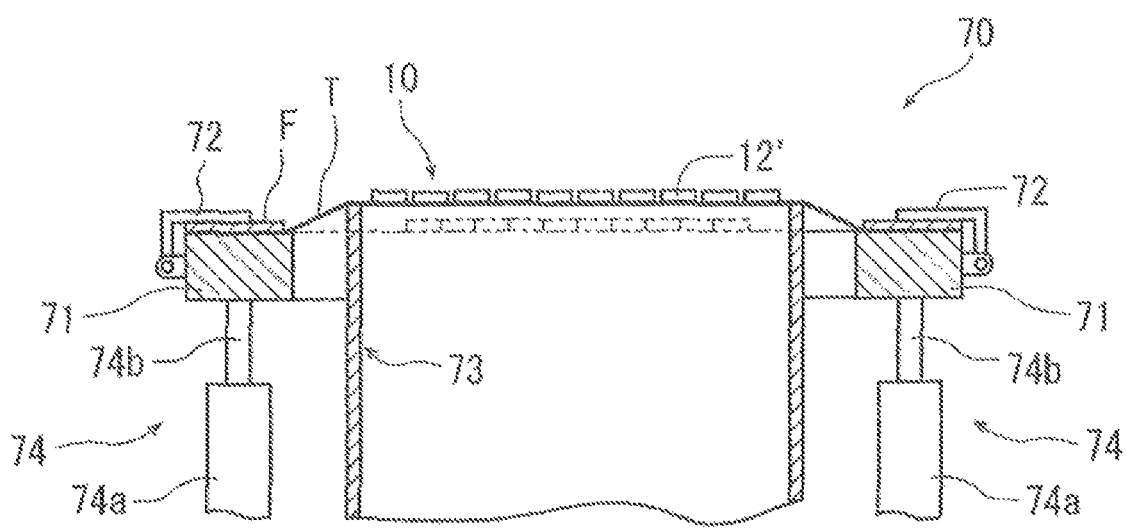
FIG. 3 is a side view of a dividing apparatus used in an implementation form of a dividing step.

The wafer 10 in which the crushed layer S has been formed inside the planned dividing lines 14 by the thermal stress wave generation step and the crushed layer formation step as described above is conveyed to the dividing apparatus 70 illustrated in FIG. 3. The dividing apparatus 70 includes an annular frame holding member 71 configured to be capable of rising and lowering and clamps 72 that hold the frame F placed on the upper surface part of the frame holding member 71. The dividing apparatus 70 includes also an expanding drum 73 that is for expanding the interval between the devices 12 of the wafer 10 mounted to the frame F held by the clamps 72 and is formed of a circular cylindrical shape in which at least the upper side is opened, and support means 74 including plural air cylinders 74a set to surround the expanding drum 73 and piston rods 74b that extend from the air cylinders 74a.

The expanding drum 73 is set to be smaller than the inner diameter of the frame F but larger than the outer diameter of the wafer 10 stuck to the protective tape T mounted on the frame F. Here, as illustrated in FIG. 3, the dividing apparatus 70 can raise and lower the frame holding member 71 to set it to the position at which the upper end part of the expanding drum 73 is at substantially the same height as the upper surface part of the frame holding member 71 (indicated by dotted lines) and to the position at which the upper end part of the expanding drum 73 is relatively higher than the upper surface part of the frame holding member 71 (indicated by solid lines).

When the frame holding member 71 is lowered as described above to relatively change the position of the upper end of the expanding drum 73 from the position indicated by the dotted lines to the higher position indicated by the solid lines, the protective tape T mounted on the frame F is expanded by the upper end edge of the expanding drum 73. Here, in the wafer 10, the crushed layer S that serves as the point of origin of dividing is formed along the planned dividing lines 14. Thus, due to the expansion of the protective tape T and action of a tensile force (external force) on the wafer 10 in a radial manner, the wafer 10 is divided into the device chips 12' as illustrated in FIG. 3. After the wafer 10 has been divided into the individual device chips 12' in this manner, the device chips 12' are picked up by an appropriate pick-up apparatus that is not illustrated in the diagram.

In the above-described embodiment, illustrated is the example in which the crushed layer S that serves as the point of origin of dividing is formed inside along the planned dividing lines 14 of the wafer 10 by executing the thermal stress wave generation step and the crushed layer formation step and the dividing step is executed by using the dividing apparatus 70 illustrated in FIG. 3 to divide the wafer 10 into the individual device chips 12'. However, when the thickness of the wafer 10 is small or through adjustment of the output power of the second pulse laser beam PL2 of the crushed layer forming means H2, it is also possible to make the state in which the wafer 10 has been divided into the individual device chips 12' by mere execution of the thermal stress wave generation step and the crushed layer formation step to form the crushed layer S along the planned dividing lines 14 without use of the dividing apparatus 70 like the one illustrated in FIG. 3. That is, in the wafer processing method of the present invention, also included is the case in which the thermal stress wave generation step and the crushed layer formation step double as the dividing step to make the state in which the wafer 10 has been divided into the individual device chips 12' with use of the crushed layer S as the point of origin of dividing.

The present invention is not limited to the above-described embodiments. For example, in the above-described embodiments, when the wafer 10 is held on the holding unit 4, the wafer 10 is held in such a manner that the front surface 10a on which the devices 12 are formed is set as the upper surface. Then, irradiation with the first pulse laser beam PL1 and the second pulse laser beam PL2 is executed from the side of the front surface 10a to form the crushed layer S inside along the planned dividing lines 14. However, the wafer 10 may be held by the holding unit 4 in such a manner that the side of the back surface 10b of the wafer 10 is set as the upper surface, and irradiation with the first pulse laser beam PL1 and the second pulse laser beam PL2 may be executed from the side of the back surface 10b to form the crushed layer S inside the wafer 10. In this case, an infrared CCD is disposed in the imaging unit 7, and the position of the planned dividing line 14 formed on the front surface 10a is detected from the side of the back surface 10b to set the processing position.

Moreover, in the above-described embodiments, the laser beam introducing part 6C is shared in the thermal stress wave generating means H1 and the crushed layer forming means H2, and irradiation with the first pulse laser beam PL1 and the second pulse laser beam PL2 is executed from the same direction. However, irradiation does not necessarily need to be executed from the same direction. Separate laser beam introducing parts may be disposed for the thermal stress wave generating means H1 and the crushed layer forming means H2, and irradiation with the first pulse laser beam PL1 and irradiation with the second pulse laser beam PL2 may be executed from different angles.

Further, in the above-described embodiments, the second pulse laser beam PL2 is caused to be absorbed to form the crushed layer S that serves as the point of origin of dividing, at a position of a depth of 0.5 mm from the front surface 10a of the wafer 10. However, by causing the second pulse laser beam PL2 to be absorbed, to form the crushed layer S near the front surface 10a, for example, at a position of 0.1 mm from the front surface 10a, a dividing groove can be formed in the front surface 10a as by ablation processing. Furthermore, in the above-described embodiments, the example in which one layer of the crushed layer S is formed inside the wafer 10 is illustrated. However, plural crushed layers S may be formed to overlap in the upward-downward direction. In this case, it is preferable to form the crushed layers S sequentially from the deepest position toward the upper side (front surface 10a).

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer processing method for dividing a semiconductor wafer into individual chips, the semiconductor wafer processing method comprising:
a holding step of holding the semiconductor wafer on a chuck table;
a thermal stress wave generation step of irradiating a region to be divided with a pulse laser beam with a wavelength having absorbability with respect to the semiconductor wafer from an upper surface of the semiconductor wafer held by the chuck table, to generate a thermal stress wave and propagate the thermal stress wave to inside of the region to be divided;

a crushed layer formation step of executing irradiation with a pulse laser beam with a wavelength having transmissibility with respect to the semiconductor wafer from the upper surface of the semiconductor wafer in matching with a time when the thermal stress wave generated in the thermal stress wave generation step reaches a depth position at which a point of origin of dividing is to be generated, wherein the time is based on a sonic speed according to a material of the semiconductor wafer, and causing absorption of the pulse laser beam with the wavelength having the transmissibility in a region in which a band gap is narrowed due to a tensile stress of the thermal stress wave, to form a crushed layer that serves as the point of origin of dividing; and a dividing step of dividing the semiconductor wafer into the individual chips with use of the crushed layer as the point of origin of dividing.

2. A semiconductor wafer processing apparatus that forms a point of origin of dividing from which a semiconductor wafer is divided into individual chips, the semiconductor wafer processing apparatus comprising:

a chuck table that holds the semiconductor wafer;

thermal stress wave generating means that irradiates a region to be divided with a pulse laser beam with a wavelength having absorbability with respect to the semiconductor wafer from an upper surface of the semiconductor wafer held by the chuck table, to generate a thermal stress wave and propagate the thermal stress wave to inside of the region to be divided; and crushed layer forming means that executes irradiation with a pulse laser beam with a wavelength having transmissibility with respect to the semiconductor wafer from the upper surface of the semiconductor wafer in matching with a time when the thermal stress wave generated by the thermal stress wave generating means reaches a depth position at which the point of origin of dividing is to be generated, wherein the time is based on a sonic speed according to a material of the semiconductor wafer, and causes absorption of the pulse laser beam with the wavelength having the transmissibility in a region in which a band gap is narrowed due to a tensile stress of the thermal stress wave, to form a crushed layer that serves as the point of origin of dividing.

3. The semiconductor wafer processing apparatus of claim 2, wherein the semiconductor wafer is made of silicon; and the thermal stress wave generating means that irradiates a region to be divided with a pulse laser beam having a wavelength of 355 nm.

4. The semiconductor wafer processing apparatus of claim 2, wherein the crushed layer forming means comprises a second laser beam generating means and a delay means that delays the pulse laser beam emitted from the second laser beam generating means by a desired time.

5. The semiconductor wafer processing apparatus of claim 4, wherein the semiconductor wafer is made of silicon; and the crushed layer forming means executes irradiation with a pulse laser beam having a wavelength of 1,064 nm.

6. A semiconductor wafer processing apparatus that forms at a target depth a point of origin of dividing from which a semiconductor wafer may be divided into individual chips, the semiconductor wafer processing apparatus comprising:

a chuck table that holds the semiconductor wafer;

a first laser oscillator that irradiates the semiconductor wafer with a first pulse laser beam with a wavelength having absorbability with respect to the semiconductor wafer from an upper surface of the semiconductor wafer held by the chuck table, to generate a thermal stress wave and propagate the thermal stress wave to inside the semiconductor water, wherein the thermal stress wave propagates through the semiconductor wafer at a sonic speed according to a material of the semiconductor wafer; and a second laser oscillator irradiates the semiconductor wafer with a second pulse laser beam with a wavelength having transmissibility with respect to the semiconductor wafer from the upper surface of the semiconductor wafer, wherein the second laser beam is irradiated in a manner so that the second laser beam reaches the target depth at the time when the thermal stress wave reaches the target depth to form a crushed layer at the target depth that serves as the point of origin of dividing.

7. The semiconductor wafer processing apparatus of claim 6, wherein the semiconductor wafer is made of silicon; and the first pulse laser beam has a wavelength of 355 nm.

8. The semiconductor wafer processing apparatus of claim 6, wherein the second laser oscillator is set to operate at the same repetition frequency as the first laser oscillator and emits the second pulse laser beam at a timing in synchronization with the first pulse laser beam;

further comprising a delay means that delays the second pulse laser beam by a desired delay time so that the second laser beam reaches the target depth at the time when the thermal stress wave reaches the target depth.

9. The semiconductor wafer processing apparatus of claim 8, wherein the delay means comprises an optical fiber with a length corresponding to the desired delay time.

10. The semiconductor wafer processing apparatus of claim 6, wherein the semiconductor wafer is made of silicon;

the first pulse laser beam has a wavelength of 355 nm;

the second pulse laser beam has a wavelength of 1,064 nm; and the second laser oscillator is set to operate at the same repetition frequency as the first laser oscillator and emits the second pulse laser beam at a timing in synchronization with the first pulse laser beam, the repetition frequency being 50 kHz.

11. The semiconductor wafer processing apparatus of claim 6, wherein the target depth is 0.5 mm from a front surface of the semiconductor wafer.

12. The semiconductor wafer processing apparatus of claim 6 that can divide a wafer into individual chips without detecting an upper surface height of the semiconductor wafer.

13. The semiconductor wafer processing apparatus of claim 6 wherein a height of an upper surface of the wafer does not need to be detected and the target depth is controlled based on a propagation time calculated based on the sonic speed according to the material that forms the wafer.

14. A semiconductor wafer processing method for dividing a semiconductor wafer into individual chips, the semiconductor wafer processing method comprising:

holding the semiconductor wafer on a chuck table;

irradiating a region of the wafer to be divided with a first pulse laser beam with a wavelength having absorbability with respect to the semiconductor wafer from an upper surface of the semiconductor wafer held by the chuck table, to generate a thermal stress wave, wherein the thermal stress wave propagates through the semiconductor wafer at a sonic speed according to a material of the semiconductor wafer;

irradiating a region of the wafer to be divided with a second pulse laser beam with a wavelength having transmissibility with respect to the semiconductor wafer from the upper surface of the semiconductor wafer, wherein the second laser beam is irradiated in a manner so that the second laser beam reaches a target depth within the wafer at the time when the thermal stress wave reaches the target depth to form a crushed layer at the target depth; and dividing the semiconductor wafer into the individual chips with use of the crushed layer as a point of origin of dividing.

15. The semiconductor wafer processing method of claim 14, wherein
the semiconductor wafer is made of silicon; and
the first pulse laser beam has a wavelength of 355 nm.

16. The semiconductor wafer processing method of claim 14,
wherein the second pulse laser beam is irradiated at the same repetition frequency as the first pulse laser beam and the second pulse laser beam is irradiated at a timing in synchronization with the first pulse laser beam;
further comprising delaying the second pulse laser beam by a desired delay time so that the second laser beam reaches the target depth at the time when the thermal stress wave reaches the target depth.

17. The semiconductor wafer processing method of claim 14, wherein
the semiconductor wafer is made of silicon;
the first pulse laser beam has a wavelength of 355 nm;
the second pulse laser beam has a wavelength of 1,064 nm;
the second pulse laser beam is irradiated at the same repetition frequency as the first pulse laser beam and the second pulse laser beam is irradiated at a timing in synchronization with the first pulse laser beam, the repetition frequency being 50 kHz.

18. The semiconductor wafer processing method of claim 14, wherein the target depth is 0.5 mm from a front surface of the semiconductor wafer.

19. The semiconductor wafer processing method of claim 14 wherein the wafer is divided into individual chips without detecting an upper surface height of the semiconductor wafer.

20. The semiconductor wafer processing method of claim 14 wherein the wafer is divided into individual chips without a height of an upper surface of the wafer being detected and whereby the target depth is controlled based on a propagation time calculated based on the sonic speed according to the material that forms the wafer.

* * * * *